United States Patent
Xu et al.

(10) Patent No.: US 9,998,155 B2
(45) Date of Patent: Jun. 12, 2018

(54) SIGNAL PROCESSING DEVICE, SIGNAL PROCESSING METHOD, INFORMATION PROCESSING PROGRAM AND RECORDING MEDIUM

(71) Applicant: OMRON Corporation, Kyoto (JP)

(72) Inventors: Ziqiang Xu, Kusatsu (JP); Katsufumi Yoshida, Ibaraki (JP)

(73) Assignee: OMRON Corporation, Kyoto (JP)

( * ) Notice: Subject to any disclaimer, the term of this patent is extended or adjusted under 35 U.S.C. 154(b) by 0 days. days.

(21) Appl. No.: 15/381,132

(22) Filed: Dec. 16, 2016

(65) Prior Publication Data
US 2017/0222670 A1  Aug. 3, 2017

(30) Foreign Application Priority Data

Jan. 29, 2016  (JP) .................................. 2016-016348

(51) Int. Cl.
| | |
|---|---|
| H04B 1/04 | (2006.01) |
| H04L 29/08 | (2006.01) |
| G05B 19/05 | (2006.01) |
| G01G 23/10 | (2006.01) |
| H03H 17/02 | (2006.01) |

(52) U.S. Cl.
CPC ......... *H04B 1/0475* (2013.01); *G05B 19/054* (2013.01); *H04L 67/125* (2013.01); *G01G 23/10* (2013.01); *G05B 2219/1161* (2013.01); *G05B 2219/1176* (2013.01); *H03H 17/025* (2013.01); *H03H 17/0294* (2013.01)

(58) Field of Classification Search
CPC ... G01G 23/10; H03H 17/025; H03H 17/0294
See application file for complete search history.

(56) References Cited

U.S. PATENT DOCUMENTS

| | | | |
|---|---|---|---|
| 6,578,098 B1 * | 6/2003 | Meiyappan | G06F 13/4213 710/104 |
| 6,907,128 B2 * | 6/2005 | Kimura | G01G 3/147 381/71.1 |
| 8,693,063 B2 * | 4/2014 | Ikeno | H04N 1/40056 358/443 |

FOREIGN PATENT DOCUMENTS

JP  2014-153234  8/2014

OTHER PUBLICATIONS

Atmel Corp, "AVR121:Enhancing ADC resolution by oversampling," Sep. 1, 2005, Available at: http://www.atmel.com/doc8003.pdf.

(Continued)

*Primary Examiner* — Ross Varndell
(74) *Attorney, Agent, or Firm* — JCIPRNET (57) ABSTRACT

The invention relates to a signal processing device, a signal processing method, an information processing program and a recording medium, which removes wide-range frequency noise. In a signal processing device (10), a cycle of acquiring a signal from a sensor is a data acquisition cycle, which is shorter than a cycle of forwarding time sequence data from which noise is removed to a controller, that is, a forwarding cycle.

7 Claims, 4 Drawing Sheets

(56) References Cited

OTHER PUBLICATIONS

Texas Instruments, "16-Bit, 8-Channel, Software Configurable Analog Input Module for Programmable Logic Controllers (PLCs)," Sep. 30, 2014, Available at: http://www.ti.com/lit/ug/tidu365b/tidu365b.pdf.
Siemens Siemens, "SIMATIC Controllers," Nov. 1, 2011, Available at: http://www.automation.siemens.com/salesmaterial-as/brochure/en/brochure_simatic-controller_en.pdf.
"Search Report of Europe Counterpart Application", dated Aug. 22, 2017, p. 1-p. 11, in which the listed references were cited.

\* cited by examiner

SIGNAL PROCESSING DEVICE, SIGNAL PROCESSING METHOD, INFORMATION PROCESSING PROGRAM AND RECORDING MEDIUM

CROSS-REFERENCE TO RELATED APPLICATION

This application claims the priority benefit of Japanese application serial no. 2016-016348, filed on Jan. 29, 2016. The entirety of the above-mentioned patent application is hereby incorporated by reference herein and made a part of this specification.

BACKGROUND OF THE INVENTION

1. Field of the Invention

The present invention relates to a signal processing device and the like, and particularly to a signal processing device that processes a signal from a sensor and forwards the signal to a control device and the like.

2. Description of Related Art

A signal processing device is known to acquire physical quantity detected by a sensor installed in an industrial machine such as a metering device from the sensor, perform signal processing on an acquired detection signal, and forward the detection signal to a control device that controls the industrial machine. In the signal processing device, an analog signal acquired from the sensor is amplified, is converted to a digital signal by using an analog/digital (A/D) converter and forwarded to the control device. Moreover, the signal processing device removes noise from the digital signal through a digital filter and sends the digital signal to the control device.

In a control system including the signal processing device, there are a variety of metering objects (generally referred as works) metered by the metering device, and noise generated corresponding to the metering objects may also vary. Therefore, the noise that should be removed in the signal processing device is not necessarily the same, and the frequency of the noise that should be removed has to set corresponding to the metering objects each time.

In addition, for example, a technology is disclosed in Patent Document 1, that is, in the metering device, a rotational speed signal of a motor is used as a basic frequency, and generation of an abnormal state is judged by using amplitude of a particular frequency calculated by multiplying the basic frequency by multiplying power. According to the technology, the abnormal state can be judged by using the rotational speed signal of the motor, and thus the abnormal state can be judged easily even if the metering objects change.

PRIOR ART DOCUMENT

Patent Document

Patent Document 1: Japanese patent publication No. 2014-153234 (published on Aug. 25, 2014)

SUMMARY OF THE INVENTION

Problem to be Solved

However, in the former technology as stated above, a problem exists that wide-frequency noise cannot be removed due to the reasons illustrated below. That is, generally, when acquiring a digital signal from an A/D converter, a digital filter can remove noise at a specified frequency from the digital signal. However, the frequency of the noise that can be removed by the digital filter depends on a sampling frequency of the A/D converter. That is, the higher the sampling frequency is, the wider the frequency range of the noise that can be removed by the digital filter.

Herein, in the signal processing device of the former technology, the sampling frequency of the A/D converter is synchronized with a cycle of forwarding a signal form which noise is removed to the control device (forwarding cycle). The forwarding cycle is sometimes also a long cycle of several ms. In this case, the sampling frequency of the A/D converter becomes low, and the digital filter cannot remove high-frequency noise.

The present invention is accomplished in view of the problem, aimed at achieving a signal processing device that can remove wide-range frequency noise and the like.

Means of Solving the Problem

To solve the problem, the signal processing device of the present invention processes a signal from a sensor and forwards the signal to a control device, wherein the signal processing device includes: an acquisition element that acquires the signal from the sensor with a specified data acquisition cycle, thereby generating time sequence data; a noise removal element that removes frequency noise from the time sequence data; and a forwarding element that periodically forwards the time sequence data, from which the frequency noise is removed via the noise removal element, to the control device with a specified forwarding cycle, the data acquisition cycle is shorter than the forwarding cycle.

According to the composition, the acquisition element acquires the signal from the sensor with a specified data acquisition cycle, thereby generating time sequence data, which thus produces the following effects, that is, no matter how the forwarding cycle is, the noise removal element can remove wide-range frequency noise. Moreover, according to the composition, the acquisition element acquires the signal from the sensor with the data acquisition cycle shorter than the forwarding cycle, thereby generating time sequence data, which thus produces the following effects, that is, the noise removal element may not delay to remove the noise. Therefore, the signal processing device produces the following effects, that is, it can forward the signal from the sensor without delay and in the form of high-precision time sequence data to the control device.

The signal processing device of the present invention may also be as follows: the control device is a master device in a master-slave control system, the master-slave control system including the master device and one or more than one slave device connected with the master device via a network, and the forwarding cycle is synchronous with a control cycle of the master device.

According to the composition, the signal processing device produces the following effects, that is, it can forward the signal from the sensor in the form of high-precision time sequence data to the master device with a cycle synchronous with the control cycle of the master device.

In the signal processing device of the present invention, it may also be that the forwarding cycle is an integer multiple of two or more than two of the data acquisition cycle.

Herein, in the case that the forwarding cycle is not an integer multiple of the data acquisition cycle, the midway of acquiring the signal by the acquisition element may be timing to forward the signal to the control device, that is, the period during which the acquisition element acquires the signal may become short. Moreover, in the case of a short acquisition period, the acquisition element may acquire the signal incompletely.

According to the composition, the forwarding cycle is an integer multiple of two or more than two of the data acquisition cycle, and thus a situation can be avoided that the midway of acquiring the signal by the acquisition element becomes timing to forward the signal to the control device, that is, a situation can be avoided that the period during which the acquisition element acquires the signal may become short. Therefore, the signal processing device produces the following effects, that is, a situation can be avoided that the acquisition element acquires the signal incompletely, so as to avoid occurrence of a situation that the acquired incomplete signal is forwarded to the control device in the form of the time sequence data.

The signal processing device of the present invention may also be as follows: the signal from the sensor is an analog signal, the acquisition element is an A/D converter, and the data acquisition cycle is a sampling cycle of converting the analog signal to a digital signal by the A/D converter.

According to the composition, the A/D converter converts the analog signal from the sensor to the digital signal with the sampling cycle shorter than the forwarding cycle, which thus produces the following effects, that is, no matter how the forwarding cycle is, the noise removal element can remove wide-range frequency noise. Moreover, according to the composition, the A/D converter converts the analog signal from the sensor to the digital signal with the sampling cycle shorter than the forwarding cycle, which thus produces the following effects, that is, the noise removal element may not delay to remove the noise. Therefore, the signal processing device produces the following effects, that is, it can forward the signal from the sensor without delay and in the form of high-precision time sequence data to the control device.

The signal processing device of the present invention may also be as follows: the sensor is a load cell.

According to the composition, the signal processing device produces the following effects, that is, it can forward the signal from the load cell without delay and in the form of high-precision time sequence data to the control device.

The signal processing device of the present invention may also be as follows: the noise removal element is a digital filter.

According to the composition, the acquisition element acquires the signal from the sensor with the data acquisition cycle shorter than the forwarding cycle, thereby generating time sequence data, which thus produces the following effects, that is, no matter how the forwarding cycle is, the digital filter can remove wide-range frequency noise. Moreover, according to the composition, the acquisition element acquires the signal from the sensor with the data acquisition cycle shorter than the forwarding cycle, thereby generating time sequence data, which thus produces the following effects, that is, the digital filter may not delay to remove the noise. Therefore, the signal processing device produces the following effects, that is, it can forward the signal from the sensor without delay and in the form of high-precision time sequence data to the control device.

To solve the problem, the signal processing method of the present invention processes a signal from a sensor and forwards the signal to a control device, wherein the signal processing method includes: an acquisition step of acquiring the signal from the sensor with a specified data acquisition cycle, thereby generating time sequence data; a noise removal step of removing frequency noise from the time sequence data; and a forwarding step of periodically forwarding the time sequence data, from which the frequency noise is removed via the noise removal step, to the control device with a specified forwarding cycle, the data acquisition cycle is shorter than the forwarding cycle.

According to the method, in the acquisition step, the signal is acquired from the sensor with the data acquisition cycle shorter than the forwarding cycle, thereby generating time sequence data, which thus produces the following effects, that is, no matter how the forwarding cycle is, in the noise removal step, wide-range frequency noise can be removed. Moreover, according to the method, in the acquisition step, the signal is acquired from the sensor with the data acquisition cycle shorter than the forwarding cycle, thereby generating time sequence data, which thus produces the following effects, that is, in the noise removal step, removal of the noise may not be delayed. Therefore, the signal processing method produces the following effects, that is, the signal from the sensor can be forwarded to the control device without delay and in the form of high-precision time sequence data.

Effect of the Invention

The present invention can produce an effect of removing wide-range frequency noise.

DESCRIPTION OF THE EMBODIMENTS

Embodiment 1

Embodiment 1 of the present invention is described below in detail based on FIG. 1 to FIG. 4. Identical symbols are marked for identical or equivalent parts in the figures and are not repeatedly described. To facilitate understanding of a formal signal processing device 110 (signal processing device) of the present invention, a profile of a control system 1 including the signal processing device 110 is described first by using FIG. 2.

(Profile of a Control System of Embodiment 1)

Figure 2:
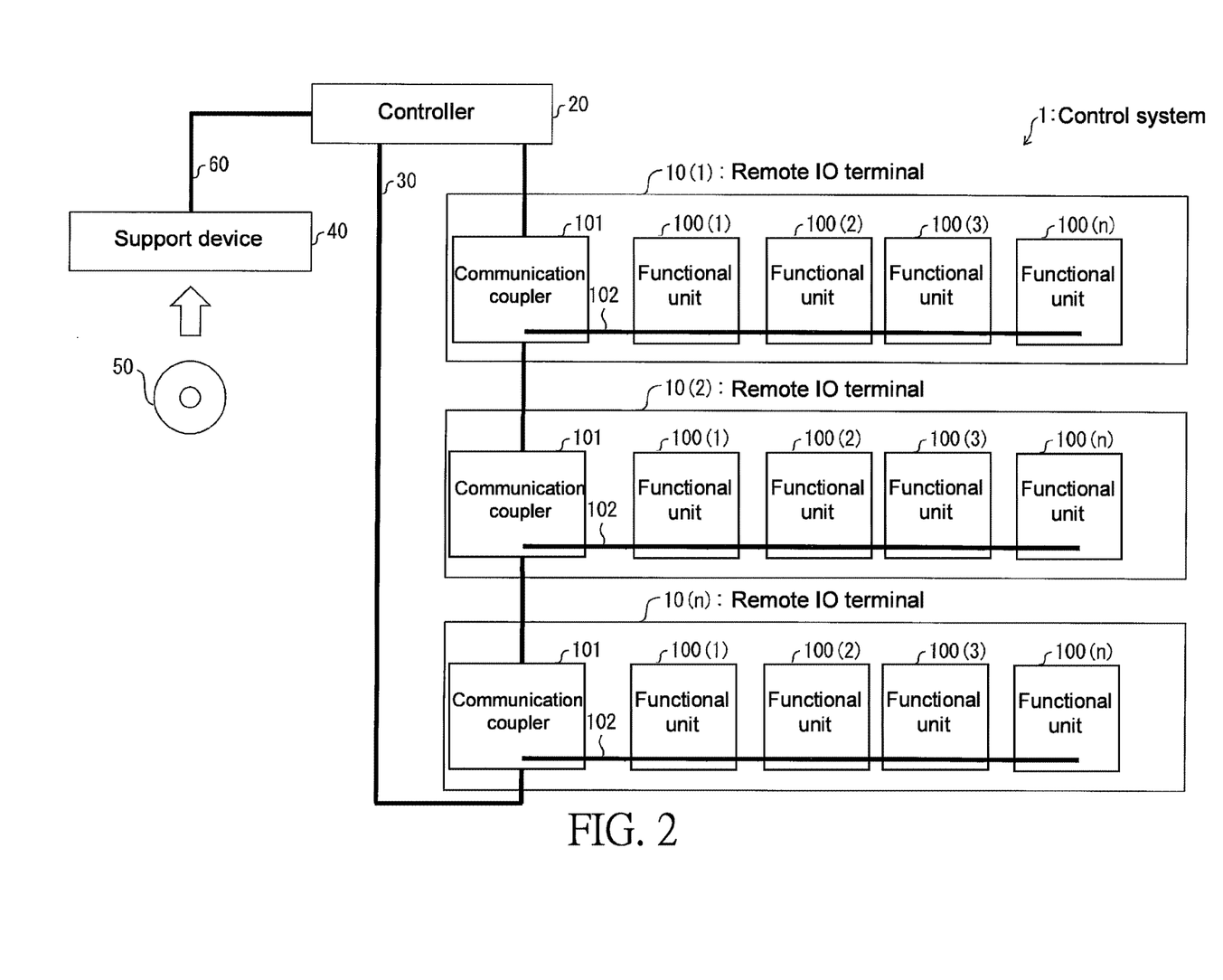
FIG. 2 is an overall profile diagram of a control system 1 according to this embodiment.

FIG. 2 is a diagram of a profile of a control system 1 including the signal processing device 110. As shown in FIG. 2, the control system 1 includes a controller 20 (control device), and one or more than one remote input/output (I/O) terminal 10 connected to the controller 20 via a field network 30 (an upper bus, that is, an upper communication network). That is, the control system 1 is a master-slave control system, and the master-slave control system includes a controller 20 as a master device and one or more than one remote IO terminal 10 (which is more specifically a communication coupler 101) connected to the master device as a slave device via a network (field network 30). The controller 20 is referred to as "master device" in a sense of managing data transmission via the field network 30, and on the other hand, the remote IO terminal 10 (which is more specifically a communication coupler 101) is referred to as "slave device".

In the control system 1 illustrated in FIG. 2, multiple remote IO terminals 10 (which are more specifically communication couplers 10(1), 10(2), . . . , 10(n)) are connected to the controller 20 via the field network 30. In addition, in the situation where it is unnecessary to particularly distinguish the remote IO terminals 10(1), 10(2), . . . , 10(n) respectively, the remote IO terminals are referred to as "remote IO terminals 10".

In addition, as a slave device, the remote IO terminal may also be a servo driver or the like (not shown) to be directly connected to the field network 30. Moreover, multiple controllers 20 may also be connected to the field network 30, any controller 20 is used as a master device, and the remaining controllers 20 are used as slave devices. Then, control bodies different from both the controllers 20 and the remote IO terminals 10 may also be used as master devices. That is, "master device" and "slave device" are defined from control functions of data transmission on the field network 30, but what information is transmitted and received between the devices is not particularly defined.

The controller 20, for example, may be a Programmable Logic Controller (PLC), and is a master device that manages data transmission in the control system 1 via the field network 30. As a slave device connected to the controller 20 as a master device, in addition to the remote IO terminal 10, a servo terminal (not shown) and the like directly connected to the field network 30 may also be included. Then, in a situation where multiple controllers 20 are connected to the field network 30, there is also a situation where any controller 20 becomes a master device and the remaining controllers 20 become slave devices. Then, alternatively, control bodies different from both the controllers 20 and the remote IO terminals may also become master devices. Moreover, as shown in FIG. 2, a support device 40 is connected on the controller 20 via a cable 60 or the like.

In addition, the controller 20 includes a Central Processing Unit (CPU) unit performing main operation processing, and may also include one or more than one functional units connected to the CPU unit via an internal bus. The functional units that the controller 20 may include are the same as the functional units 100 included in the following remote IO terminal 10, and thus will be described later in detail.

The field network 30 transmits various data received or sent by the controller 20, for example, EtherCAT (registered trademark), PROFINET (registered trademark), MECHATROLINK (registered trademark)-III, Powerlink, SERCOS (registered trademark)-III, and CIP Motion. Moreover, the field network 30, for example, may also be a DeviceNet, a CompoNet (registered trademark) or the like. In addition, the control system 1 that sequentially forwards data frames on the field network 30 so as to transmit and receive data between the controllers 20 and the remote IO terminals 10 or between the remote IO terminals 10 is described in the following. Moreover, in the following description, in order to be compared with the internal bus 102 as a lower communication network, the field network 30 is sometimes referred to as "upper bus (upper communication network)". Then, in order to distinguish data frames transmitted on the internal bus 102, the data frames on the field network 30 are referred to as "upper data frames".

The support device 40 is an information processing device that sets various parameters for the control system 1. That is, state value acquisition (input refresh) timing and output value update (output refresh) timing may also be calculated and set by the support device 40. The support device 40 typically includes a general-purpose computer. For example, an information processing program performed by the support device 40 may also be stored in a Compact Disk-Read Only Memory (CD-ROM) 50 to circulate. The program stored in the CD-ROM 50 is read by a CD-ROM drive not shown, and stored in a hard disk of the support device 40 and the like. Alternatively, it may also be constructed to download the program from an upper host computer or the like via the network.

The remote IO terminals 10 are used for expansibly configuring functional units that the controllers 20 may include in positions different from configuration positions of the controllers 20. That is, the functional units 100 included in the remote IO terminals 10 are the same as the functional units that the controllers 20 may include (one or more than one functional unit that can be connected to the CPU units of the controllers 20 via the internal bus). The remote IO terminals 10 include: a communication coupler 101, for performing processing related to data transmission in the field network 30; and one or more than one functional unit 100 connected to the communication coupler 101 via the internal bus 102.

In the remote IO terminals 10 illustrated in FIG. 2, multiple functional units 100 (which are specifically functional units 100(1), 100(2), 100(3), . . . , 100(n)) are connected to the communication coupler 101 via the internal bus 102. In addition, in a situation where it is unnecessary to particularly distinguish the functional units 100(1), 100(2), 100(3), . . . , 100(n) respectively, they are referred to as "functional units 100". In a situation where multiple functional units 100 are connected to the internal bus 102, the multiple functional units 100 can transmit and receive data mutually via the internal bus 102.

The communication coupler 101 is connected to the controllers 20 (more specifically, the CPU units that the controller 20s have) via the field network 30, and controls data transmission between the controllers 20. Moreover, the communication coupler 101 controls actions of the functional units 100, and manages data transmission between the functional units 100 via the internal bus 102. That is, the communication coupler 101 is not only connected to the internal bus 102 but also connected to the field network 30. The communication coupler 101 manages data transmission via an upper bus, i.e., the field network 30, and manages data transmission via a lower bus, i.e., the internal bus 102.

The functional units 100 transmit and receive signals between control objects (not shown), which, for example, are IO units (or special units). As described later, the functional units 100 include a signal processing device 110. The IO units, for example, control transmitting and receiving (input/output) of binary data. Specifically, the IO units can collect (receive) information such as some objects detected (turned on) or not detected (turned off) by a sensor. Moreover, the IO units can output (send) instructions of activating (turning on) or inactivating (turning off) specified output objects (e.g., a relay, an actuator and so on). Moreover, the special units can perform functions not performed by the IO units, for example, input/output of analog data, various controls, specified communications that cannot be performed by the IO units (e.g., serial communications, encoder inputs).

In the remote IO terminals 10, one or more than one functional units 100(1), 100(2), . . . , 100(n) can perform data transmission with the communication coupler 101 via the internal bus 102 as a communication line. In the internal bus 102, for example, object data may also be arranged into the form of a column according to a time sequence to be transmitted by serial communication. When the multiple functional units 100 receive data frames transmitted in the internal bus 102 respectively, data is decoded from the data frames, and necessary processing is performed. Moreover, the multiple functional units 100 regenerate data frames respectively, and retransmit (forward) the data frames to a lower-level function unit 100. In addition, in the following description, in order to be distinguished from the data frames (upper data frames) transmitted on the field network 30, the data frames transmitted on the internal bus 20 are sometimes referred to as "internal bus frames".

Next, for the control system 1 of which the profile has been described above, sync of various processing performed in the devices included in the control system 1 is outlined.

(Sync for Various Processing in the Control System)

In the control system 1, when control (some processing) over the same control object is performed, sometimes, sync is preferably obtained between multiple state values acquired from the control object. That is, in the control system 1, sometimes, multiple state values related to the control object are acquired respectively from the control object at the same timing, and output values and the like for the control object are calculated based on the acquired state values.

In order to synchronize various processing between the controller 20 (master device) and one or more than one remote IO terminal 10 (slave device), as one sync method, the control system 1 has a distribute clock (DC)-based time sync function. For example, the controller 20 and the one or more than one remote IO terminal 10 each have a timer periodically generating time information as a sync reference (reference clock) as a timer. The timer of the controller 20 as a master device becomes a reference, and the remote IO terminal 10 as the salve device is synchronous with the timer of the controller 20. More specifically, the one or more than one remote IO terminal 10, based on the upper data frames periodically transmitted on the field network 30, modifies time offset generated by their own timer each time. Thus, at the timing the same as the reference clock generated by the timer of the controller 20, reference clocks are generated inside the one or more than one remote IO terminal 10. Therefore, a common time can be utilized essentially between the controller 20 and the one or more than one remote IO terminal 10.

The one or more than one remote IO terminal 10 performs pre-specified processing respectively at the timing specified on a common time axis. However, transmission delay of the upper data frames exists. Therefore, for example, a time difference TD1 may be generated between the timing (time T1) at which utilization of processing on the data included in the upper data frames can begin in the remote IO terminal 10(1) and the timing (time T2) at which utilization of processing on the data included in the upper data frames can begin in the remote IO terminal 10(2). The same is also true between other remote IO terminals 10.

As the transmission delay, i.e., the time difference (TD1-TDn), is tiny time, it is not a problem in the case of a general control object. However, for multi-axis control, multiple actuators synchronize control objects performing actions, to make sync (consistency) between acquisition (input refresh) timing of state values from the control objects and update (output refresh) timing for output values of the control objects become important between one or more than one remote IO terminal 10 (or between functional units 100 installed into different remote IO terminals 10).

The control system 1 has the function of "input/output sync" described below. That is, starting timing of processing is adjusted between one or more than one remote IO terminal 10, so that processing is begun from the time Ts. In order to achieve such input/output sync, necessary processing starting timing (phase/delay starting time) in respective functional units 100 is set based on a certain time respectively for one or more than one remote IO terminal 10. With the set timing, the functional units 100 each trigger necessary processing. As a result, input refresh and output refresh timing are real-time synchronized between the one or more than one remote IO terminal 10.

In addition, as a common time can be utilized between the master device and one or more than one slave device, input/output sync between all or some of the controller 20 and one or more than one remote IO terminal 10 connected to the field network 30. Details are described further in the following.

The controller 20 repeats a user program with a predetermined control cycle (PLC control cycle). The user program typically includes a sequence program and a motion program. In the controller 20, before execution of the user program, the processing (input refresh) of acquiring state values from control objects is performed. Moreover, in the controller 20, after execution of the user program, the processing (output refresh) of reflecting results (output values) calculated through the execution is performed. Typically, a period from the starting of previous output refresh to the starting of next output refresh is calculated as a control cycle (PLC control cycle) of the controller 20.

When the output refresh in the controller 20 is accomplished, sending of upper data frames including the calculated results (output values) begins through output refresh via the field network 30. The upper data frames sent from the controller 20 are sequentially forwarded to the communication coupler 101 via the field network 30. The time from first arrival of an upper data frame to the communication coupler 101 of the remote IO terminal 10(1) to first arrival of the same upper data frame to the communication coupler 101 of the remote IO terminal 10(2) is equivalent to "transmission delay".

Moreover, the control cycle (PLC control cycle) in the controller 20 is consistent with the cycle of sending out the upper data frames (forwarding cycle).

In each of the one or more than one remote IO terminal 10, when receiving of the upper data frames in the communication coupler 101 is accomplished, the communication coupler 101 performs the following processing. That is, the communication coupler 101 transmits data (internal bus frames) oriented to the functional units 100 (i.e., included in the remote IO terminal 10) connected to the communication coupler 101 via the internal bus 102 to the functional units 100 via the internal bus 102.

The internal bus frames transmitted, via the internal bus 102, by one or more than one functional unit 100 connected to the communication coupler 101 via the internal bus 102 are updated (output refresh) for output values of the control objects. Then, the functional units 100 acquire (input refresh) state values from the control objects respectively. Then, data including the state values acquired by the functional units 100 (the internal bus frames including state values) is transmitted to the communication coupler 101 via the internal bus 102. Then, the communication coupler 101 reflects contents of the received "the internal bus frames including state values" to the upper data frames (i.e., the data frames transmitted on the field network 30), and forwards them to the lower-level communication coupler 101 (lower-level remote IO terminal 10).

Details will be described later herein, however, in the control system 1, the functional units 100 periodically acquire (input refresh) cycles of state values from the control objects, and a cycle shorter than the cycle of forwarding the upper data frames to the controller 20 on the field network 30 is a forwarding cycle. More specifically, in the control system 1, a data acquisition cycle of an acquisition element 112 (which, in the case that the acquisition element 112 is an A/D converter, is a sampling cycle of the acquisition element 112) is shorter than a cycle of sending the upper data frames (forwarding cycle), i.e., the control cycle (PLC control cycle) in the controller 20. However, preferably, cycles of periodically acquiring (input refresh) state values from the control objects by one or more than one functional unit 100 respectively are identical. That is, in the control system 1, cycles (data acquisition cycles) of periodically acquiring (input refresh) state values from the control objects by one or more than one functional unit 100 respectively are identical between the one or more than one functional unit 100, and the data acquisition cycles are shorter than the forwarding cycle.

In this way, the remote IO terminal 10 (the communication coupler 101) acquires data indicating output values from the upper data frames that have arrived, and gives the acquired output values to each functional unit 100. At the same time, the remote IO terminal 10 (the communication coupler 101) acquires a state value from the functional unit 100, and adds data indicating the acquired state value to the upper data frames sequentially transmitted in the field network 30. That is, data update processing between the controller 20 and the remote IO terminal 10 (the communication coupler 101) via the field network 30 and data update processing between the communication coupler 101 and the functional unit 100 via the internal bus 102 are performed in parallel.

In the control system 1, the timing of updating the output values (if expressed strictly, the timing of accomplishing update of the output values) by one or more than one functional unit 100 is consistent between the one or more than one functional unit 100. The timing of updating the output values is also referred to as "OUT data output sync timing". In the OUT data output sync timing, data (OUT data) should be output has to be given to all the functional units 100. Therefore, the timing of starting output refresh is determined according to the time required by output processing of each functional unit 100 and the like.

Moreover, in the control system 1, the timing of acquiring (input refresh) state values from the control objects is consistent between one or more than one functional unit 100. The timing of acquiring the state values is also referred to as "IN data latch sync timing". The so-called "IN data latch" refers to acquiring the value of a signal input into the functional unit 100 at certain timing. The remote IO terminal 10 has to acquire (input refresh) the state values from the control objects before arrival of the upper data frames in the next transmission cycle. As the upper data frames are sequentially forwarded, according to the mounting positions of the remote IO terminals 10 in the field network 30, the upper data frames arrive at different timing. Therefore, the IN data latch sync timing is determined by considering the time required by input processing of the functional unit 100 and transmission delay generated in the upper data frames.

In addition, the data acquisition cycle (the cycle of acquiring an output signal from a sensor 120 by the acquisition element 112) described hereinafter is the cycle of the IN data latch sync timing. The data acquisition cycle is a sampling cycle of the acquisition element 112 in the case that the acquisition element 112 is an A/D converter. In the control system 1, the data acquisition cycle of the acquisition element 112 (which, in the case that the acquisition element 112 is an A/D converter, is a sampling cycle of the acquisition element 112) is shorter than the control cycle (PLC control cycle) in the controller 20, i.e., the cycle of sending out the upper data frames (forwarding cycle). That is, in the control system 1, the cycle of the IN data latch sync timing is shorter than the forwarding cycle. Moreover, the cycle of sending out the upper data frames, i.e., the forwarding cycle, is an integer multiple of two or more than two of the data acquisition cycle of the acquisition element 112. In the control system 1, inputs of the one or more than one functional unit 100 are synchronous, but input cycles (data acquisition cycles) of the one or more than one functional unit 100 are shorter than the control cycle (PLC control cycle) in the controller 20, i.e., the cycle of sending out the upper data frames (forwarding cycle).

With the composition, input refresh and output refresh timing of the functional units 100 can be synchronous with each other even if between different remote IO terminals 10, and thus, for example, multi-axis control and the like can be achieved with higher precision.

In addition, in the control system 1, "state values from the control objects" acquired by the one or more than one functional unit 100 are periodically forwarded to the controller 20 (control device) through the upper data frames. The cycle of forwarding the "state values from the control objects" acquired by the one or more than one functional unit 100 to the controller 20 (control device) is the forwarding cycle, is a cycle of sending out the upper data frames, and is consistent with the control cycle (PLC control cycle) in the controller 20.

Details will be described hereinafter, but the output signal of the sensor 120 on which the signal processing device 110 performs signal processing is periodically forwarded to the controller 20 (control device) through the communication coupler 101. That is, a transmitting and receiving element 115 of the signal processing device 110 sends the "output signal of the sensor 120" from which noise is removed by a noise removal element 113 to the communication coupler 101. Thus, the output signal of the sensor 120 from which noise is removed (on which the signal processing device 110 performs signal processing) is periodically forwarded to the controller 20 (control device) through the communication coupler 101. The transmitting and receiving element 115 of the signal processing device 110 forwards, via the communication coupler 101, the output signal of the sensor 120 from which noise is removed by the noise removal element 113 to the controller 20 with the forwarding cycle. The cycle of forwarding performed by the transmitting and receiving element 115 via the communication coupler 101 (forwarding cycle) is consistent with the control cycle (PLC control cycle) of the controller 20.

So far, for the control system 1, an example of making output refresh timing and input refresh timing consistent with each other between all the functional units 100 has been described. However, in the control system 1, in addition to the setting of making output refresh timing and input refresh consistent with each other between all the functional units 100, the setting of making output refresh consistent with at least one of the input refresh consistent with each other between some functional units 100 may also be made.

That is, it may also be as follows: output refresh and input refresh are consistent with each other between particular functional units 100 in multiple functional units 100 making up the control system 1, and for the remaining functional units 100, output refresh and input refresh are performed at the timing different from the output refresh and input refresh timing of the particular functional units 100. Specifically, in the control system 1, processing sync may not be ensured for all the remote IO terminals connected to the controller 20 via the field network 30, and processing sync may not be ensured for all the functional units 100 in the control system 1.

So far, sync of various processing performed by the control system 1 and the devices (master device and slave devices) included in the control system is described by using FIG. 2. Next, the functional units 100 of the control system 1 are described by using FIG. 1.

(For a Sensor)

Figure 1:
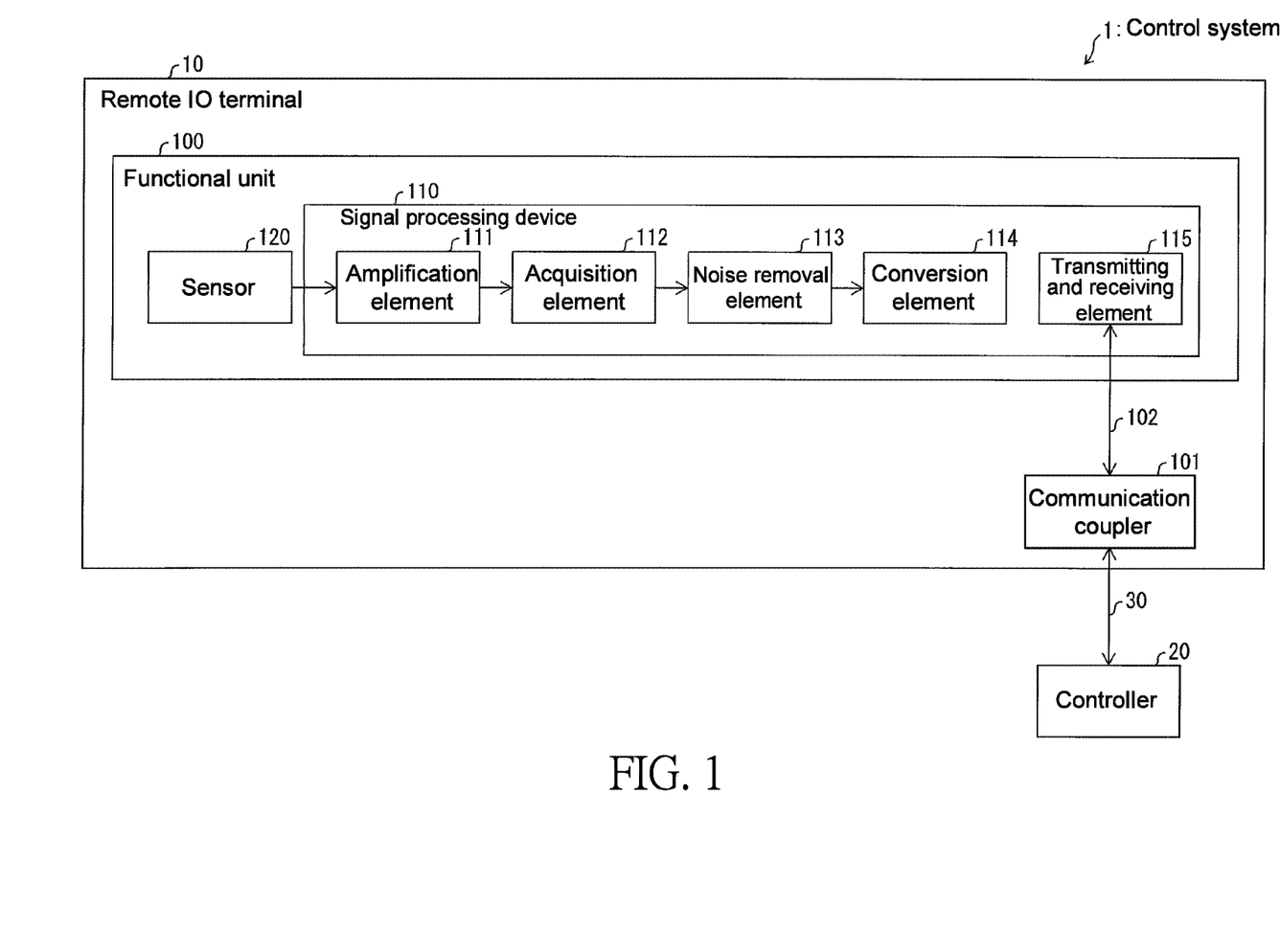
FIG. 1 is a block diagram of main parts of a signal processing device according to Embodiment 1 of the present invention.

Firstly, a profile of a sensor 120 used in this embodiment is described. The sensor 120 detects physical quantity (state values) of control objects (not shown), and outputs a signal (e.g., analog signal) corresponding to the detected physical quantity. The state values of the control objects detected by the sensor 120 may be any physical quantity such as weight and pressure.

The sensor 120, for example, is a load cell mounted to a control object (e.g., an industrial machine such as a metering device). According to the composition, the signal processing device 100 produces the following effects, that is, a signal from the sensor 120 (load cell) can be forwarded to the controller 20 (control device) without delay and in the form of high-precision data sequence data.

Herein, the load call generally includes a Wheatstone bridge circuit using a strainmeter, and according to an applied load (weight or pressure), the resistance of the strainmeter changes. Thus, the output voltage changes. The controller 20 exports a measured value according to a change of the output voltage (output signal).

As a use example of the sensor 120, a platform scale system, a quantitative cutout control system, a press-in system and the like can be listed, and this embodiment is also applicable to the systems.

The so-called platform scale system is a system that places a metering object on a platform scale and measures the weight of the metering object. Multiple sensors 120 (load cells) are mounted below the platform scale, and respective output signals are input to a unit calculating output signals of the sensors 120 which is referred to as a mathematic box. A summation (summing value) of the output signals output from the mathematic box are sent to the controller 20 via the signal processing device 110 (load cell interface unit). The controller 20 can export a weight value according to the summing value.

The so-called quantitative cutout control system is a system that measures the weight of a raw material input into a hopper, and discharges the raw material to a container, which measures the weight of the raw material in the hopper and controls a valve in order of large input->middle input->small input.

The multiple sensors 120 (load cells) are mounted to a position where the weight of the hopper can be measured, respective output signals are input to the mathematic box, and a summation (summing value) of the output signals output from the mathematic box are sent to the controller 20 via the signal processing device 110 (load cell interface unit). The controller 20 can export a metering value according to the summing value, and control the hopper.

The so-called press-in system is a system that produces a product that bonds two parts by press-in, for example, it performs press-in by applying a load to the parts through a servo driver. The sensors 120 (load cells) are mounted to a position where the load can be measured, and whether the product is defective is judged according to whether the load measured by the sensors 120 is suitable. Next, details of the signal processing device 110 are described with reference to FIG. 1.

(For a Signal Processing Device)

To facilitate understanding of the signal processing device 110, before the details of the signal processing device 110 are described with reference to FIG. 1, if a profile of the signal processing device 110 is sorted, it is described as follows:

(Profile of the Signal Processing Device)

That is, the signal processing device 110 is a signal processing device that processes a signal from a sensor 120 (an output signal of the sensor 120) and forwards the signal to a controller 20 (control device), including: an acquisition element 112 that acquires the signal from the sensor 120 with a specified data acquisition cycle, thereby generating time sequence data; a noise removal element 113 that removes frequency noise from the time sequence data; and a transmitting and receiving element 115 (forwarding element) that periodically forwards the time sequence data, from which the frequency noise is removed via the noise removal element 113, to the controller 20 with a specified forwarding cycle, the data acquisition cycle is shorter than the forwarding cycle.

According to the composition, the acquisition element 112 acquires an output signal from the sensor 120 with the data acquisition cycle shorter than the forwarding cycle, thereby generating time sequence data, which thus produces the following effects, that is, no matter how the forwarding cycle is, the noise removal element 113 can remove wide-range frequency noise. Moreover, according to the composition, the acquisition element 112 acquires an output signal from the sensor 120 with the data acquisition cycle shorter than the forwarding cycle, thereby generating time sequence data, which thus produces the following effects, that is, the noise removal element 113 removes the noise without delay. Therefore, the signal processing device 110 produces the following effects, that is, it can forward the signal from the sensor 120 to the controller 20 without delay and in the form of high-precision time sequence data.

In addition, details will be described later, but the transmitting and receiving element 115 (forwarding element) sends the "output signal of the sensor 120" from which noise is removed to a communication coupler 101, thus making the communication coupler 101 forward the "output signal of the sensor 120" from which noise is removed to the controller 20 (control device) with the forwarding cycle. That is, the transmitting and receiving element 115 periodically forwards (via the communication coupler 101) the time sequence data from which the frequency noise is removed by the noise removal element 113 to the controller 20 with a specified forwarding cycle.

Particularly, in the signal processing device 110, the forwarding cycle (the cycle during which the time sequence data from which the frequency noise is removed by the noise removal element 113 is forwarded to the controller 20) is an integer multiple of two or more than two of the data acquisition cycle (the cycle of acquiring the output signal from the sensor 120 by the acquisition element 112).

Herein, in the case that the forwarding cycle is not an integer multiple of the data acquisition cycle, the midway of acquiring the output signal from the sensor 120 by the acquisition element 112 may be timing to forward the output signal from the sensor 120 to the controller 20 (control device), that is, the period during which the acquisition element 112 acquires the output signal from the sensor 120 may become short. Moreover, in the case of a short acquisition period, the acquisition element 112 may acquire an incomplete output signal from the sensor 120.

According to the composition, the forwarding cycle is an integer multiple of two or more than two of the data acquisition cycle, and thus a situation can be avoided that the midway of acquiring the output signal from the sensor 120 by the acquisition element 112 becomes timing to forward the output signal from the sensor 120 to the control device, that is, a situation can be avoided that the period during which the acquisition element 112 acquires the output signal from the sensor 120 may become short. Therefore, the signal processing device 110 produces the following effects, that is, a situation can be avoided that the acquisition element 112 acquires the incomplete output signal from the sensor 120, so as to avoid occurrence of a situation that the acquired incomplete signal is forwarded to the controller 20 in the form of the time sequence data.

Moreover, the processing performed by the signal processing device 110 may be sorted as follows. That is, the signal processing method performed by the signal processing device 110 is a signal processing method of processing a signal from a sensor 120 (an output signal from the sensor 120) and forwarding the signal to a controller 20 (control device), including: an acquisition step of acquiring the output signal from the sensor 120 with a specified data acquisition cycle, thereby generating time sequence data; a noise removal step of removing frequency noise from the time sequence data; and a forwarding step of periodically forwarding the time sequence data, from which the frequency noise is removed via the noise removal step, to the controller 20 with a specified forwarding cycle, the data acquisition cycle is shorter than the forwarding cycle.

According to the method, in the acquisition step, the output signal is acquired from the sensor 120 with the data acquisition cycle shorter than the forwarding cycle, thereby generating time sequence data, which thus produces the following effects, that is, no matter how the forwarding cycle is, in the noise removal step, wide-range frequency noise can be removed. Moreover, according to the method, in the acquisition step, the output signal is acquired from the sensor 120 with the data acquisition cycle shorter than the forwarding cycle, thereby generating time sequence data, which thus produces the following effects, that is, in the noise removal step, removal of the noise may not be delayed. Therefore, the signal processing method produces the following effects, that is, the signal from the sensor 120 can be forwarded to the controller 20 without delay and in the form of high-precision time sequence data.

Next, details of the signal processing device 110 of which the profile is sorted as above are described with reference to FIG. 1.

(Details of the Signal Processing Device)

FIG. 1 is a block diagram of main parts of a signal processing device 110. The signal processing device 110, for example, is a load cell interface unit, and is a unit having a sensor signal (load cell output signal) input processing function for measuring weight (g, kg, etc.) and pressure (N, kN, etc.). The signal processing device 110, for example, amplifies an output signal from a sensor 120 as a load cell therein, performs A/D conversion, and converts the output signal to any physical quantity such as weight and pressure to be output to a controller 20.

Herein, the signal processing device 110 shown in FIG. 1 consists of an amplification element 111, an acquisition element 112, a noise removal element 113, a conversion element 114 and a transmitting and receiving element 115.

The amplification element 111 amplifies a signal (e.g., an analog signal) acquired from the sensor 120. In addition, the signal processing device 110 does not necessarily have the amplification element 111.

The acquisition element 112 periodically acquires an output signal from the sensor 120, and sends the output signal to the noise removal element 113. In addition, the acquisition element 112 periodically acquires an output signal from the sensor 120, and thus finally acquires a time sequence output signal (time sequence signal) from the sensor 120. That is, the acquisition element 112 acquires the signal from the sensor 120 with a specified data acquisition cycle, thereby generating time sequence data, and sends the generated time sequence data to the noise removal element 113.

The acquisition element 112, for example, is an A/D converter. That is, in the case that the output signal from the sensor 120 is an analog signal, the data acquisition cycle of the acquisition element 112 as an A/D converter is a sampling cycle of converting the analog signal from the sensor 120 to a digital signal.

According to the composition, the acquisition element 112 as an A/D converter converts the analog signal from the sensor 120 (output signal from the sensor 120) to a digital signal with the sampling cycle shorter than the forwarding cycle, which thus produces the following effects, that is, no matter how the forwarding cycle is, the noise removal element 113 can remove wide-range frequency noise. Moreover, according to the composition, the acquisition element 112 as an A/D converter converts the analog signal from the sensor 120 to a digital signal with the sampling cycle shorter than the forwarding cycle, which thus produces the following effects, that is, the noise removal element 113 removes the noise without delay. Therefore, the signal processing device 110 produces the following effects, that is, it can forward the analog signal from the sensor 120 to the controller 20 without delay and in the form of high-precision time sequence data.

In addition, the acquisition element 112 that acquires a signal from the sensor 120 with a specified data acquisition cycle to generate time sequence data may also be divided into a function element that acquires a signal from the sensor 120 with a specified data acquisition cycle, and a function element that converts the signal from the sensor 120 to a specified signal.

The noise removal element 113 removes noise (e.g., frequency noise) from the output signal of the sensor 120 acquired from the acquisition element 112 (especially the time sequence data generated by the acquisition element 112 from the signal of the sensor 120). Then, the noise removal element 113 outputs (sends) the signal from which noise is removed (the output signal of the sensor 120; especially the output signal of the sensor 120 acquired by the acquisition element 112) to the conversion element 114 (or the transmitting and receiving element 115).

The noise removal element 113, for example, is a digital filer. The noise removal element 113 as a digital filter, for example, can remove frequency noise from a digital signal.

The digital signal is generated by performing A/D conversion on the analog signal of the sensor 120 as a load cell by the acquisition element 112 as an A/D converter.

That is, the acquisition element 112 acquires an output signal from the sensor 120 with the data acquisition cycle shorter than the forwarding cycle, thereby generating time sequence data, which thus produces the following effects, that is, no matter how the forwarding cycle is, the noise removal element 113 as a digital filter can remove wide-range frequency noise. Moreover, according to the composition, the acquisition element 112 acquires an output signal from the sensor 120 with the data acquisition cycle shorter than the forwarding cycle, thereby generating time sequence data, which thus produces the following effects, that is, the noise removal element 113 as a digital filter removes the noise without delay. Therefore, the signal processing device 110 produces the following effects, that is, it can forward the signal from the sensor 120 to the controller 20 without delay and in the form of high-precision time sequence data.

In the case that the noise removal element 113 is a digital filter, the type and number of the filter of the noise removal element 113 as a digital filter are not particularly limited, for example, the type of the filter may include a lowpass filter, a moving average filter, a notch filter and so on. In addition, as the notch filter only removes a frequency to be removed, in the case that a frequency which is an integer multiple of the frequency to be removed, another notch filter has to be prepared, but the moving average filter can also remove the frequency which is an integer multiple of the frequency to be removed. Therefore, the moving average filter is ideal. Moreover, there may be multiple moving average filters and notch filters, which thus has the following advantages.

Generally, in a metering system, due to mechanical vibration, electrical noise and the like in metering, metering precision may produce an error. Especially, due to mechanical vibration in a mechanical system of the metering system and inherent vibration of metering objects, metering values sometimes may be unstable. Thus, a digital filter for removing influences of such vibration is required. Moreover, considering that such external disturbances (mechanical vibration of the mechanical system and inherent vibration of metering objects) may be multi-layered, influences are removed by inserting multiple digital filters in series, which can thus suitably remove the influences.

The conversion element 114 converts the output signal of the sensor 120 (especially the signal acquired by the acquisition element and denoised by the noise removal element 113) to data indicating any physical quantity (weight, pressure, etc.). In addition, the signal processing device 110 does not necessarily include the conversion element 114.

The transmitting and receiving element 115 sends the "output signal of the sensor 120" acquired by the acquisition element and denoised by the noise removal element 113 (time sequence data from which noise is removed by the noise removal element 113) to the controller 20. The transmitting and receiving element 115, for example, sends "output signal of the sensor 120" converted by the conversion element 114 to data indicating any physical quantity to the controller 20.

More accurately, the transmitting and receiving element 115 sends the time sequence data from which noise (frequency noise) is removed by the noise removal element 113 to a communication coupler 101. The communication coupler 101 periodically forwards the signal received from the signal processing device 110 (the transmitting and receiving element 115) to the controller 20 (control device) with a specified forwarding cycle. That is, the "output signal of the sensor 120" from which noise is removed by the noise removal element 113 is sent to the communication coupler 101 by the transmitting and receiving element 115, so that the "output signal of the sensor 120" from which noise is removed is periodically forwarded to the controller 20 (control device). The transmitting and receiving element 115 periodically forwards, via the communication coupler 101, the output signal of the sensor 120 from which noise is removed by the noise removal element 113 (which is, more specifically, time sequence data generated from the output signal of the sensor 120) to the controller 20 with a specified forwarding cycle.

Next, for the signal processing device 110 of which the profile is described above, signal processing (especially noise removal processing) performed in the signal processing device 110 is detailed.

(For Signal Processing)

Figure 3:
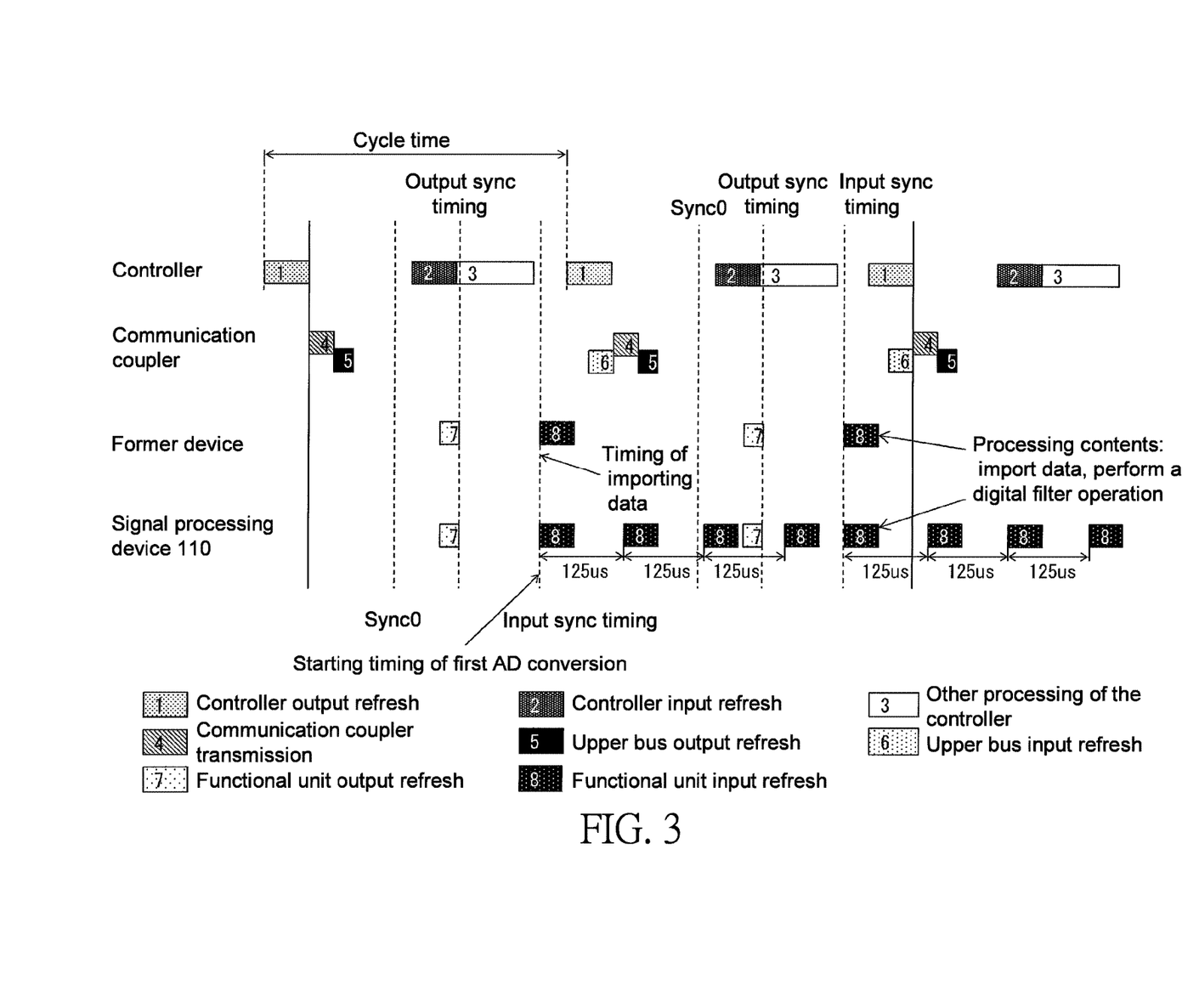
FIG. 3 is a diagram of description about a difference between timing of processing performed by the signal processing device of FIG. 1 and timing of processing performed by the former signal processing device.

FIG. 3 is a diagram of description about a difference between timing of signal processing performed by the signal processing device 110 and timing of signal processing performed by the former signal processing device.

As stated above, in the control system 1, the control system 1 synchronizes output refresh and input refresh timing between one or more than one functional unit 100. Specifically, in the control system 1, the timing of updating the output values (if expressed strictly, the timing of accomplishing update of the output values) by one or more than one functional unit 100 is consistent (synchronous) between the one or more than one functional unit 100. Moreover, in the control system 1, the timing of acquiring (input refresh) state values from the control objects by one or more than one functional unit 100 respectively is consistent (synchronous). In the control system 1, repeated cycles of output refresh and input refresh of one or more than one functional unit 100 are consistent with the PLC control cycle. The control system 1 synchronizes input refresh and output refresh timing of the one or more than one functional unit 100 with each other, which thus, for example, can achieve multi-axis control with more precision. However, the repeated cycle (data acquisition cycle) of input refresh of the one or more than one functional unit 100 is shorter than the control cycle (PLC control cycle) of the controller 20, that is, shorter than the forwarding cycle.

In the following, various processing of sync in the control system 1 (e.g., the processing of acquiring state values from control objects by the functional unit 100) is referred to as "sync processing". Moreover, the control cycle (PLC control cycle) in the controller 20, i.e., the cycle of sending out upper data frames in the field network 30, is referred to as "sync cycle" in the following. In addition, as stated above, in the control system 1, the cycle of forwarding the "output signal of the sensor 120" on which the signal processing device 110 performs signal processing to the controller 20 (control device) is the forwarding cycle, is the cycle of sending out upper data frames in the field network 30, and is consistent with the control cycle (PLC control cycle) of the controller 20, that is, synchronous with the sync cycle.

In the control system 1, the sync processing has to be performed with the set sync cycle and jitter (time offset and fluctuation of the signal) below 1 μs, for example, the one or more than one functional unit 100 has to import data with jitter counted as below 1 μs from IN data latch sync timing.

For example, in the case that the noise removal element 113 is a digital filer that performs digital filtering on a digital signal generated by performing A/D conversion on an analog signal of the sensor 120 as a load cell by the acquisition element 112 as an A/D converter, the following respects should be noted. Generally, the digital filter can remove noise at a specified frequency from the digital signal (digital data), but the frequency of the noise that can be removed depends on the sampling frequency of the A/D converter. That is, the higher the sampling frequency of the A/D converter is, the wider the frequency range of the noise that can be removed by the digital filter is.

In the control system 1, the sync cycle (PLC control cycle) sometimes is a long cycle of several ms. In the case of a long sync cycle, if the sampling cycle of the A/D converter is lengthened consistently with the sync cycle, the following problem may arise. That is, if the sampling cycle of the A/D converter is lengthened, the digital filter that acquires the digital signal from the A/D converter cannot identify high-frequency noise with high precision, and thus cannot remove the high-frequency noise.

In the former signal processing device having the A/D converter, the filtering of the digital filter is not add to the sync processing originally, or, even if the filtering of the digital filter is add to the sync processing, the sampling cycle of the A/D converter may also be the same as the sync cycle. Therefore, in the case that the sync cycle is a long cycle of several ms, the former signal processing device delays to sample, and cannot remove high-frequency noise.

Therefore, the acquisition element 112 of the signal processing device 110 acquires the output signal of the sensor 120 with a cycle shorter than the sync cycle. In the case that the acquisition element 112 is an A/D converter, the acquisition element 112 acquires the output signal of the sensor 120 with a sampling cycle shorter than the sync cycle. Moreover, the noise removal element 113 removes noise (frequency noise) from time sequence data generated by the acquisition element 112 according to the signal of the sensor 120 acquired with a cycle shorter than the sync cycle. In the case that the acquisition element 112 is an A/D converter, the noise removal element 113 removes noise (frequency noise) from a digital signal generated by the acquisition element 112 with a sampling cycle shorter than the sync cycle. In the case that the noise removal element 113 is a digital filter, the noise removal element 113 can remove noise (frequency noise) from a digital signal generated with a sampling cycle shorter than the sync cycle, and thus can remove wide-range frequency noise.

In FIG. 3, "cycle time" is the control cycle (PLC control cycle) of the controller 20. "Cycle time", for example, is an execution cycle of processing 1 (controller output refresh), which, more accurately, is a period from starting of the previous processing 1 to starting of the next processing 1. In FIG. 3, processing 2 (controller input refresh), processing 3 (other processing of the controller), processing 4 (communication coupler transmission), processing 5 (upper bus output refresh), processing 6 (upper bus input refresh), processing 7 (functional unit output refresh) and processing 8 (functional unit input refresh) are periodically performed respectively.

Herein, the processing 1 (controller output refresh) is processing (input refresh) of acquiring state values from control objects by the controller 20. Processing 2 (controller input refresh) is processing (output refresh) of, after the controller 20 executes a specified program (e.g., a user program), reflecting results (output values) calculated through the execution. Processing 3 (other processing of the controller) is processing other than processing 1 and processing 2 performed by the controller 20. Processing 4 (communication coupler transmission) is the processing as follows, that is, the communication coupler 101 adds data indicating state values acquired by one or more than one functional unit 100 respectively via an internal bus 102 to upper data frames, and sequentially transmits the upper data frames to which the data is added into the field network 30. Processing 5 (upper bus output refresh) is the processing as follows, that is, the communication coupler 101 acquires output values for the control objects from the upper data frames, and sends the acquired output values to the one or more than one functional unit 100 respectively via the internal bus 102. Processing 6 (upper bus input refresh) is processing of acquiring state values of control objects from the functional units 100 (e.g., the signal processing device 110) by the communication coupler 101. Processing 7 (functional unit output refresh) is processing of updating the output values (output values for the control objects) (if expressed strictly, accomplishing update of the output values) by the functional units 100. Processing 8 (functional unit input refresh) is processing of acquiring (input refresh) state values from the control objects by the functional units 100 (e.g., the signal processing device 110), which, specifically, is processing of "importing data and performing a digital filter operation (removing frequency noise)". The starting time point of processing 8 (functional unit input refresh) is the timing of importing data, that is, the timing of starting A/D conversion.

If a reference time point (Sync0) is set arbitrarily through the controller 20, output sync timing and input sync timing are set corresponding thereto. The output sync timing and the input sync timing indicate a completion time point of processing 7 (functional unit output refresh) and a starting time point of processing 8 (functional unit input refresh) respectively. The control cycle (cycle time) of the controller 20 is consistent with the forwarding cycle, that is, it is consistent with the execution cycle of processing 4 (communication coupler transmission) performed periodically.

As shown in FIG. 3, execution cycles of processing 1 to processing 7 are consistent with the control cycle (cycle time, PLC control cycle) of the controller 20. However, the cycle (execution cycle) of processing 8 (functional unit input refresh) periodically performed similar to processing 1 to processing 7 is different in the former device (the former signal processing device) and the signal processing device 110.

As shown in FIG. 3, in the former device (the former signal processing device), an interval (data acquisition cycle) from first processing 8 (functional unit input refresh) to second processing 8 (functional unit input refresh) is consistent with the control cycle (cycle time) of the controller 20.

On the other hand, in the signal processing device 110, the interval (data acquisition cycle) from first processing 8 (functional unit input refresh) to second processing 8 (functional unit input refresh) is shorter than the control cycle (cycle time) of the controller 20, that is, it is shorter than the forwarding cycle of the signal processing device 110, which, for example, is 125 μs. That is, the acquisition element 112 of the signal processing device 110 acquires the output signal of the sensor 120 with a data acquisition cycle of 125 μs shorter than the sync cycle to generate time sequence data, and outputs the generated time sequence data to the noise removal element 113. In the case that the acquisition element 112 is an A/D converter, the sampling cycle of the acquisition element 112 is 125 μs, which is shorter than the sync cycle. Moreover, noise of signal of the sensor 120 upon A/D conversion with a sampling cycle of 125 μs is removed by the noise removal element 113.

In addition, as stated above, in FIG. 3, the sync cycle (i.e., PLC control cycle, cycle time) is consistent with the forwarding cycle (the cycle during which the time sequence data, from which the frequency noise is removed by the noise removal element 113 is periodically forwarded to the controller 20). Moreover, the sync cycle is an integral multiple of the data acquisition cycle of the acquisition element 112 of the signal processing device 110 (which, in the case that the acquisition element 112 is an A/D converter, is a sampling cycle of the acquisition element 112), i.e., 125 µs. That is, the forwarding cycle is an integer multiple of two or more than two of the data acquisition cycle.

As stated above, in the control system 1, various processing performed in the devices is synchronous. For example, the remote IO terminals 10 (the communication coupler 101) have to acquire (input refresh) state values from the control objects after the upper data frames of the previous transmission cycle are transferred and before the upper data frames of the next transmission cycle arrive. Moreover, the data acquisition cycle (the cycle of acquiring the output signal from the sensor 120 by the acquisition element 112) is shorter than the forwarding cycle.

Therefore, in the case that the forwarding cycle is not an integer multiple of the data acquisition cycle, the midway of acquiring the signal by the acquisition element 112 may be timing to forward the output signal from the sensor 120 to the controller 20 (control device), that is, the period during which the acquisition element 112 acquires the output signal from the sensor 120 may become short. Moreover, in the case of a short acquisition period, the acquisition element 112 may acquire an incomplete output signal from the sensor 120.

According to the composition, the forwarding cycle is an integer multiple of two or more than two of the data acquisition cycle, and thus a situation can be avoided that the midway of acquiring the output signal from the sensor 120 by the acquisition element 112 becomes timing to forward the output signal from the sensor 120 to the controller 20, that is, a situation can be avoided that the period during which the acquisition element 112 acquires the output signal from the sensor 120 may become short. Therefore, the signal processing device 110 produces the following effects, that is, a situation can be avoided that the acquisition element 112 acquires the incomplete output signal from the sensor 120, so as to avoid occurrence of a situation that the acquired incomplete signal is forwarded to the controller 20 in the form of the time sequence data.

The above describes the difference between tinning of signal processing performed by the signal processing device 110 and timing of signal processing performed by the former signal processing device by using FIG. 3. That is, in the case that the sync cycle is a long cycle of several ms, the former signal processing device that makes the sampling cycle of the A/D converter consistent with the sync cycle delays to sample, and cannot remove high-frequency noise. On the other hand, in the signal processing device 110, the acquisition element 112 acquires the output signal of the sensor 120 with a cycle shorter than the sync cycle. Thus, the noise removal element 113 can remove noise (frequency noise) from a digital signal generated with a sampling cycle shorter than the sync cycle, and thus can remove wide-range frequency noise. Next, the relationship between the timing of signal processing performed by the signal processing device 110 and the timing of signal processing performed by other functional units 100 (e.g., other signal processing devices) is described by using FIG. 4.

(For Sync Between Signal Processing in the Signal Processing Device and Processing of Other Functional Units)

Figure 4:
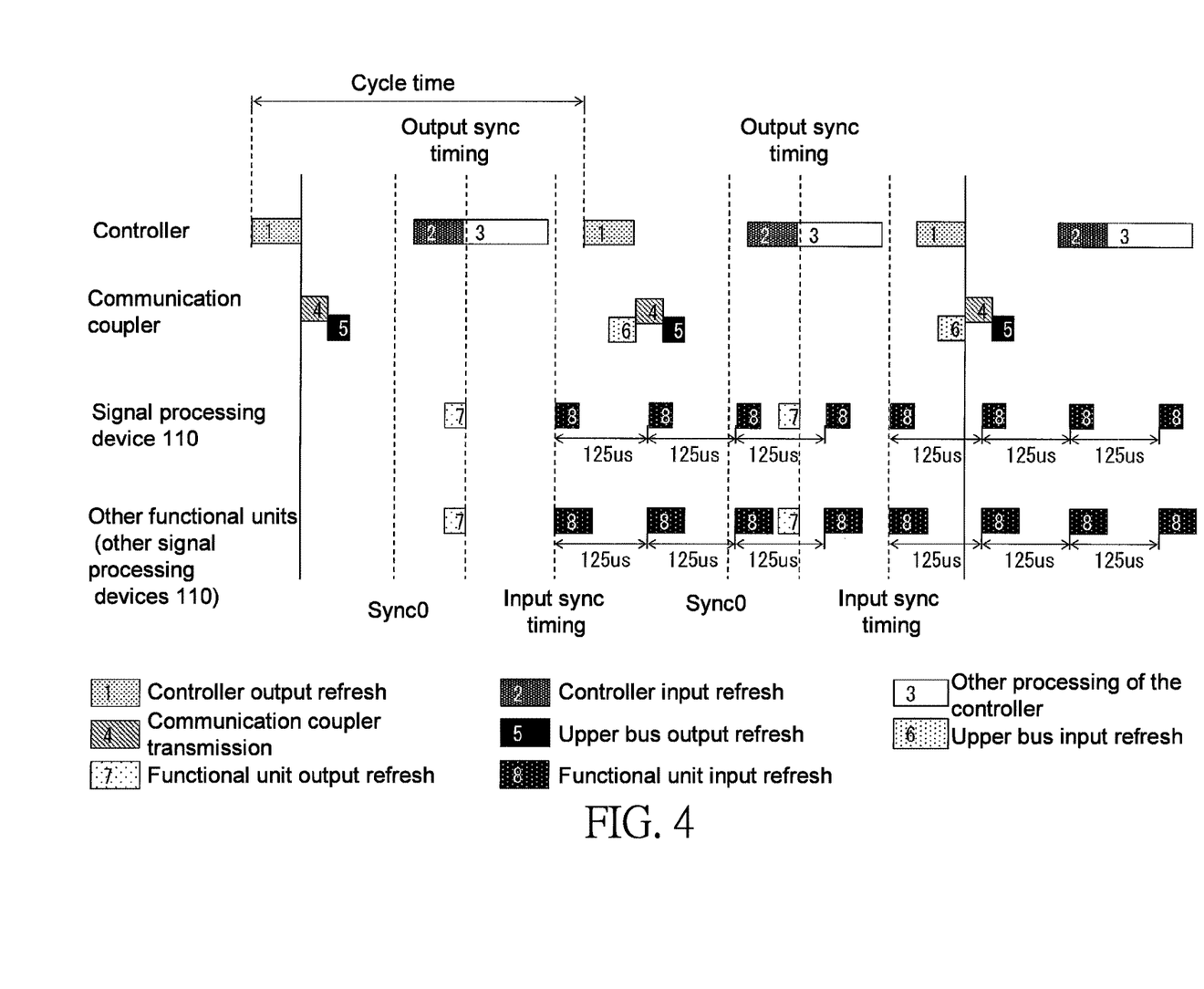
FIG. 4 is a diagram of description about sync between timing of processing performed by the signal processing device of FIG. 1 and timing of processing performed by functional units.

FIG. 4 is a diagram of description about sync between timing of processing performed by the signal processing device 110 and timing of processing performed by other functional units 100.

As shown in FIG. 4, the forwarding cycle of the signal processing device 110 (which, more accurately, is the forwarding cycle of the communication coupler 101) is synchronous with the cycle of forwarding a signal from a functional unit 100 other than the sensor 120 to the controller 20 as a master device. Moreover, similar to the illustration in FIG. 3, the acquisition element 112 of the signal processing device 110 acquires an output signal from the sensor 120 with a data acquisition cycle of 125 µs shorter than the sync cycle. Then, in the example shown in FIG. 4, other functional units 100 (e.g., other than the device, i.e., other signal processing devices 110) also acquire state values (e.g., the output signal of the sensor 120) from control objects with the data acquisition cycle of 125 µs shorter than the sync cycle.

In the example shown in FIG. 4, especially at the timing of acquiring state values from the control objects by the signal processing device 110, other functional units 100 (e.g., other than the device, i.e., other signal processing devices 110) also acquire state values from the control objects. That is, as shown in FIG. 4, at the tuning of starting processing 8 (input refresh of the functional units) by the signal processing device 110, other functional units 100 (e.g., other than the device, i.e., other signal processing devices 110) also start processing 8. The control system 1 synchronizes the timing of acquiring (input refresh) of the state values from the control objects with the timing of updating (output refresh) output values for the control objects between one or more than one remote IO terminal 10 (or between functional units 100 mounted in different remote IO terminals 10), which can thus achieve multi-axis control and the like with higher precision. Specifically, by making the starting timing of acquiring the output signal of the sensor 120 by the acquisition element 112 of the signal processing device 110 consistent with the starting timing of acquiring state values related to the control objects by other functional units 100 (e.g., other than the device, i.e., other signal processing devices 110), multi-axis control and the like can thus be achieved with higher precision.

That is, the controller 20 is a master device in a master-slave control system. The master-slave control system includes the master device and one or more than one slave device connected with the master device. The forwarding cycle (the cycle during which the time sequence data, from which the frequency noise is removed by the noise removal element 113, is periodically forwarded to the controller 20) is synchronous with the control cycle (PLC control cycle) of the master device.

According to the composition, the signal processing device 110 produces the following effects, that is, it can forward the signal from the sensor 120 to the controller 20 in the form of high-precision time sequence data with a cycle synchronous with the control cycle of the controller 20 (master device).

As stated above, the control system 1 is a master-slave control system. The master-slave control system includes a controller 20 as a master device and one or more than one slave device (remote IO terminal 10) connected to the master device via a network (field network 30). The controller 20 (control device) is a master device in the control system 1 (master-slave control system). In the control system 1, the remote IO terminals 10 as slave devices include one or more than one functional unit 100 that performs is at least one of input and output of signals between control objects. Moreover, the sensor 120 is included in the functional unit 100.

In the control system 1, for example, between all the functional units 100 included in the remote IO terminals 10 as slave devices, the timing of acquiring signals related to state values from the control objects and the timing of updating signals output to the control objects are synchronous.

Moreover, the forwarding cycle of the signal processing device 110 (which, more accurately, is the forwarding cycle of the communication coupler 101) is synchronous with the cycle of forwarding a signal from a functional unit 100 other than the sensor 120 to the controller 20 as a master device.

As sorted above, the cycle of acquiring the output signal from the sensor 120 by the acquisition element 112 of the signal processing device 110, i.e., the data acquisition cycle, is shorter than the forwarding cycle. Therefore, the noise removal element 113 of the signal processing device 110 can remove wide-range frequency noise for the output signal of the sensor 120 no matter how the sync cycle is. Moreover, the timing of acquiring the output signal from the sensor 120 by the acquisition element 112 of the signal processing device 110 is synchronous with the timing of acquiring state values related to the control objects by other functional units 100 (e.g., other than the device, i.e., other signal processing devices 110).

However, as stated above, processing sync may not be necessarily ensured for all the functional units 100 in the control system 1. That is, in the control system 1, functional units 100 intending to synchronize input refresh and output refresh may also be selectively specified according to control objects and the like. Specifically, the forwarding cycle of the signal processing device 100 related to the sensor 120 (which, more accurately, is the forwarding cycle of the communication coupler 101) may not be synchronous with the cycle of forwarding signals of other functional units 100 to the controller 20 as a master device.

(Embodiment by Means of Software)

Control blocks of the signal processing device 110 (especially the amplification element 111, the acquisition element 112, the noise removal element 113, the conversion element 114 and the transmitting and receiving element 115) can be implemented by a logic circuit (hardware) formed on an integrated circuit (IC chip) or the like, and may also be implemented by software by using a Central Processing Unit (CPU).

In the latter situation, the signal processing device 110 has a CPU that executes a command of software, i.e., program, which implements various functions, a Read Only Memory (ROM) or storage devices (which are referred to as "recording medium") recording the program and various data that can be read by a computer (or CPU), and a Random Access Memory (RAM) expanding the program, etc. Moreover, the objective of the present invention is achieved by reading and executing the program from the recording medium by the computer (or CPU). As the recording medium, "non-temporary tangible medium" can be used, for example, a tape, a disk, a card, a semiconductor memory, a programmable logic circuit and the like can be used. Moreover, the program may also be provided to the computer via any transmission medium (communication networks or broadcast waves, etc.) that can transmit the program. In addition, the present invention can also be implemented in the form of data signals instantiating the program and embedded into carriers through electronic transmission.

The present invention is not limited to the various implementations, various changes can be made within the scope indicated in the claims, and implementations obtained by properly combining technical components disclosed in different implementations respectively are also included in the technical scope of the present invention.

What is claimed is:

1. A signal processor, processing a signal from a sensor and forwarding the signal to a control device, wherein the signal processor comprises:
    an acquisition circuitry that acquires the signal from the sensor with a specified data acquisition cycle, thereby generating time sequence data;
    a noise removal circuitry that removes frequency noise from the time sequence data; and
    a forwarding circuitry that periodically forwards the time sequence data, from which the frequency noise is removed via the noise removal circuitry, to the control device with a specified forwarding cycle,
    the data acquisition cycle is shorter than the forwarding cycle,
    the forwarding cycle is an integer multiple of two or more than two of the data acquisition cycle.

2. The signal processor according to claim 1, wherein the control device is a master device in a master-slave control system, the master-slave control system comprising the master device and one or more than one slave device connected with the master device via a network, and
    the forwarding cycle is synchronous with a control cycle of the master device.

3. The signal processor according to claim 1, wherein the signal from the sensor is an analog signal,
    the acquisition circuitry is an A/D converter, and
    the data acquisition cycle is a sampling cycle of converting the analog signal to a digital signal by the A/D converter.

4. The signal processor according to claim 1, wherein the sensor is a load cell.

5. The signal processor according to claim 1, wherein the noise removal circuitry is a digital filter.

6. A signal processing method, processing a signal from a sensor and forwarding the signal to a control device, wherein the signal processing method comprises:
    an acquisition step of acquiring the signal from the sensor with a specified data acquisition cycle, thereby generating time sequence data;
    a noise removal step of removing frequency noise from the time sequence data; and
    a forwarding step of periodically forwarding the time sequence data, from which the frequency noise is removed via the noise removal step, to the control device with a specified forwarding cycle,
    the data acquisition cycle is shorter than the forwarding cycle,
    the forwarding cycle is an integer multiple of two or more than two of the data acquisition cycle.

7. A non-transitory recording medium, recording an information processing program and computer-readable,
    the information processing program is for causing a computer to process a signal from a sensor and forwarding the signal to a control device and to be configured to:
    acquire the signal from the sensor with a specified data acquisition cycle, thereby generating time sequence data;

remove frequency noise from the time sequence data; and periodically forward the time sequence data, from which the frequency noise is removed to the control device with a specified forwarding cycle, the data acquisition cycle is shorter than the forwarding cycle, the forwarding cycle is an integer multiple of two or more than two of the data acquisition cycle.

* * * * *